United States Patent [19]

Löffler et al.

[11] Patent Number: 4,469,025

[45] Date of Patent: Sep. 4, 1984

[54] DEVICE FOR FILM-MOUNTING PRINT CONTROL STRIPS AT A PRECISE LEVEL AND IN REGISTRY

[75] Inventors: Gerhard Löffler; Franz Arendt, both of Walldorf, Fed. Rep. of Germany

[73] Assignee: Heidelberger Druckmaschinen, Heidelberg, Fed. Rep. of Germany

[21] Appl. No.: 498,242

[22] Filed: May 26, 1983

[30] Foreign Application Priority Data

May 26, 1982 [DE] Fed. Rep. of Germany ....... 3219744

[51] Int. Cl.³ ............................ B41F 33/00; G01J 3/46
[52] U.S. Cl. .................................. 101/171; 101/211; 33/184.5; 356/421; 430/358
[58] Field of Search ............... 101/1, 171, 211, 151, 101/181, 174, 426, 365; 33/1 B, 184.5; 434/98; 430/301, 358; 356/421, 422, 423, 424, 425, 402, 404, 408

[56] References Cited

U.S. PATENT DOCUMENTS

| 3,099,089 | 7/1963 | Bond et al. ........................ 33/184.5 |
| 3,288,059 | 11/1966 | Atkinson ........................ 101/151 X |
| 3,326,682 | 6/1967 | Endermann et al. ............... 430/358 |
| 3,393,618 | 7/1968 | Baker ............................... 101/426 X |
| 3,501,852 | 3/1970 | Hartel et al. .......................... 434/98 |
| 3,832,070 | 8/1974 | Cox ................................... 356/421 X |
| 3,890,048 | 6/1975 | Abbandio et al. .................. 356/425 |
| 4,060,643 | 11/1977 | Blanks ................................. 430/301 |
| 4,286,385 | 9/1981 | Huck .............................. 101/211 X |
| 4,299,165 | 11/1981 | Nichols et al. .................. 101/181 X |
| 4,310,248 | 1/1982 | Meredith ............................ 356/422 |

Primary Examiner—E. H. Eickholt
Attorney, Agent, or Firm—Herbert L. Lerner; Laurence A. Greenberg

[57] ABSTRACT

A device for film-mounting print control strips at a precise level and in registry including a foil forming a template for a mounting foil when mounting a print control strip, the foil template containing ink and measuring-field information necessary for the film mounting at a precise level and in registry, and further containing a characteristic of printing plate centers.

10 Claims, 1 Drawing Figure

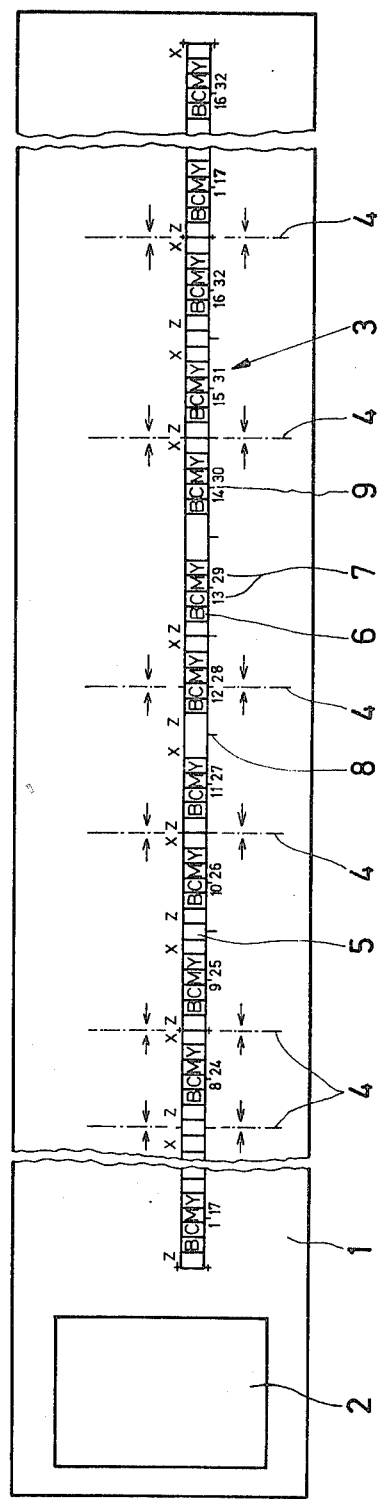

DEVICE FOR FILM-MOUNTING PRINT CONTROL STRIPS AT A PRECISE LEVEL AND IN REGISTRY

The invention relates to a device for film-mounting print control strips at a precise level and in registry.

Print control strips are often printed together with printed matter, such as autotypy especially, for monitoring the quality thereof during production and review of the printed matter. They differ in construction and composition in accordance with the desired focal points of information. With respect to the color or ink impression, they permit the evaluation of the individual colors sharing in a multicolor print, which is hardly possible in the joint printing of the printing matter per se.

Moreover, print control strips permit a selective judgment of values or parameters of an ink or color which, next to the maintenance of register of a print is most vital for the ink impression, namely ink film thickness, elementary area or scanning element size and shape, by means of indirect measurement values such as color density.

The measurement values determined at the print control strips are assigned to the individual ink zones into which the ink duct is subdivided.

This required assignment makes it necessary that, in printing machine systems controlled in accordance with ink density, the print control strips must assume an exactly defined position on the sheet being printed. The center or middle of the machine preferably serves as reference for the correct assignment and for the exactly defined location, respectively, of the print control strip.

To find or seek out the desired location, the heretofore known systems employ markings on the print control strips themselves. Additional digits or numerals for format and color serve as further aids.

Sometimes, however, for reasons of space availability, the measurement strips must be as narrow as possible. In such cases, the films must be clipped or trimmed directly at the upper and lower measurement-strip edges, whereby naturally, in addition to other information, the level or station markings also are discarded or lost. A mounting or montage is then possible only by means of a second sample or pattern of a previously completed comparative montage or a printed sheet. Add to this that the measurement strip extracts existing for each printing ink or color must be applied in register sequentially onto the respective montages or mountings of the ink or color extracts. Also, the center markings or register crosses and register lines, respectively, must thereby be used in connection, for example, with a machine-stand sheet. In free-system print control strips which cannot contain any machine centers, specific register lines must be brought into relationship, for example, with the machine-stand sheet. Incorrectly disposed mountings or montages of individual inks or colors is thereby easily possible.

It is even more problematic if a print control strip set for the purpose of first forme and perfector printing must be applied in part to the montage of the first forme side and in part of the perfector side of the sheet.

Because print control strips, as a rule, are formed of units which must be strung together in the film montage, the aforementioned difficulties are repeated for each individual section, to which there is added that, inadvertently, or in a preceding use, intentionally shortened units can be recognized only with difficulty and can, therefore, not be mounted precisely level.

In consideration of the aforementioned difficulties, it is an object of the invention to provide a device which avoids those difficulties and, with the help of which, the individual print control strip units can always be mounted precisely level and in register on the montages or mountings of the respective individual inks or colors.

With the foregoing and other objects in view, there is provided, in accordance with the invention, a device for film-mounting print control strips at a precise level and in registry, comprising a foil forming a template for a mounting foil when mounting a print control strip, the foil template containing ink and measuring-field information necessary for film mounting at a precise level and in registry, and further containing a characteristic of printing plate centers.

Thereby, in an advantageous manner, the application of information in the form of markings or other characteristics on or to the respective print control strips, which would otherwise be lost when severing the film, can be dispensed with. Moreover, faults or defects occurring when stringing together the print control strip units can be excluded or avoided.

In accordance with another feature of the invention, the foil template has an exact image of a print control strip applied thereto, the image being formed of exact measurement-field positions, marking of ink zones and identification thereof, a color characteristic and the characteristic of the printing plate centers.

In accordance with a further feature of the invention, the foil template has solely a skeleton-type image of a print control strip applied thereto, the image being formed of measuring field limiting lines and zone dividing lines as well as the printing plate centers.

In accordance with an additional feature of the invention, the image is of one color, and the ink information is given in a characteristic.

In accordance with again another feature of the invention, the image is multicolored.

In accordance with still a further feature of the invention, the foil template is formed of thin, flat and distortion-limited material.

In accordance with again a further feature of the invention, the foil template is formed of transparent material.

In accordance with still another feature of the invention, the foil template is formed of opaque material.

In accordance with again an additional feature of the invention, the foil template has an exact image of a print control strip applied thereto, the image being formed of exact measurement-field positions, markings of centers of ink zones and identification thereof, a color characteristic and the characteristic of the printing plate centers.

In accordance with a concomitant feature of the invention, the foil template has an exact image of a print control strip applied thereto, the image being formed of exact measurement-field positions, markings of ink zones and of centers of ink zones and identification thereof, a color characteristic and the characteristic of the printing plate centers.

Other features which are considered as characteristic for the invention are set forth in the appended claims.

Although the invention is illustrated and described herein as embodied in a device for film-mounting print control strips at a precise level and in registry, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments, when read in connection with the single FIGURE of the drawing which is a diagrammatic plan view of the device for film-mounting print control strips at a precise level and in registry in accordance with the invention.

Referring now to the FIGURE of the drawing, there is shown a mounting-aid foil 1 preferably formed of a thin, flat and poorly deformable material, the poorly deformable nature of which being especially dependent upon the humidity in the air.

The transparency thereof is significant for the manufacture of montages which may be turned over on both sides. Onto the illustrated mounting-aid foil 1 there is applied, in addition to a characteristic field 2 provided with general data, a complete true-to-size impression or copy of a print control strip 3 which contains ink or color and measurement field-type information which is required for a precisely level mounting or montage, as well as a characteristic for machine centers 4 which are involved and, if desired or necessary, a characteristic of the machine types. The individual colors are characterized or marked with various alphabetical letters, the letters B, C, M and Y representing, respectively black, cyan, magenta and yellow. The thus marked measurement fields 6 simultaneously provide the information that full-tone fields are involved. The empty fields 5 marked with the letters X and Z are provided for the full-tones of a fifth color X or a sixth color Z or, if there are less than six ink colors, are occupied by other measurement field types of existing colors.

Parallel to the measurement fields 6, a scale is copied on the foil which corresponds to the ink zone division of the ink duct. The zones of the scale are marked with consecutive digits 7 in accordance with the numbering of the ink zones in the inking unit of the printing machine. The individual zones proper, as well as the centers of the zones, are represented by longer marking lines 8 for the zones and shorter marking lines 9 for the zone centers.

The thus formed mounting-aid foil 1 is placed under the montage or mounting foil as a template during mounting of the print control strips, the marked machine center 4 determining or establishing the side level position. This might also be possible by means of register holes or perforations, in which case the various perforations of the different machines would have to be taken into consideration.

Instead of the exact copy or impression of the print control strip 3 represented in the illustrated embodiment of the invention, it may also be conceivable to use only a skeleton-like impression with the same information content and formed only of the measuring field limit or border lines and zone division lines 8 as well as the printing plate centers 4. Furthermore, it may be conceivable to supply the individual color information, not by means of a characteristic thereof, but rather through the intermediary of a multicolor arrangement or design of the copy or duplicate. The application of the copy on the transparently or opaquely arranged or designed mounting-air foil can be effected photochemically, by printing or by any other suitable copying process.

We claim:

1. Device for film-mounting print control strips at a precise level and in registry comprising a foil forming a template for a mounting foil when mounting a print control strip, said foil template containing ink and measureing-field information necessary for film mounting at a precise level and in registry, and further containing a characteristic of printing plate centers.

2. Device according to claim 1, wherein said foil template has an exact image of a print control strip applied thereto, said image being formed of exact measurement-field positions, marking of ink zones and identification thereof, a color characteristic and said characteristic of said printing plate centers.

3. Device according to claim 1, wherein said foil template has solely a skeleton-type image of a print control strip applied thereto, said image being formed of measuring field limiting lines and zone dividing lines as well as said printing plate centers.

4. Device according to claim 2 wherein said image is of one color, and said ink informaion is given in a characteristic.

5. Device according to claim 2 wherein said image is multicolored.

6. Device according to claim 1 wherein said foil template is formed of thin, flat and distortion-limited material.

7. Device according to claim 1 wherein said foil template is formed of transparent material.

8. Device according to claim 1 wherein said foil template is formed of opaque material.

9. Device according to claim 1 wherein said foil template has an exact image of a print control strip applied thereto, said image being formed of exact measurement-field positions, markings of centers of ink zones and identification thereof, a color characteristic and said characteristic of said printing plate centers.

10. Device according to claim 1 wherein said foil template has an exact image of a print control strip applied thereto, said image being formed of exact measurement-field positions markings of ink zones and of centers of ink zones and identification thereof, a color characteristic and said characteristic of said printing plate centers.

* * * * *